(12) United States Patent
Zojer

(10) Patent No.: US 9,479,159 B2
(45) Date of Patent: Oct. 25, 2016

(54) SYSTEM AND METHOD FOR A SWITCH HAVING A NORMALLY-ON TRANSISTOR AND A NORMALLY-OFF TRANSISTOR

(71) Applicant: Infineon Technologies Austria AG, Villach (AT)

(72) Inventor: Bernhard Zojer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 64 days.

(21) Appl. No.: 14/473,101

(22) Filed: Aug. 29, 2014

(65) Prior Publication Data

US 2016/0065203 A1    Mar. 3, 2016

(51) Int. Cl.
*H03K 3/00* (2006.01)
*H03K 17/687* (2006.01)
*H02M 1/088* (2006.01)
*H02M 1/32* (2007.01)
*H02M 7/162* (2006.01)
*H02M 1/00* (2006.01)

(52) U.S. Cl.
CPC .......... *H03K 17/687* (2013.01); *H02M 1/088* (2013.01); *H02M 1/32* (2013.01); *H02M 7/1626* (2013.01); *H02M 2001/0054* (2013.01)

(58) Field of Classification Search
None
See application file for complete search history.

(56) References Cited

U.S. PATENT DOCUMENTS

| | | |
|---|---|---|
| 4,437,096 A | 3/1984 | Brightman et al. |
| 4,992,924 A | 2/1991 | Gousset et al. |
| 5,285,369 A | 2/1994 | Balakrishnan |
| 5,705,950 A | 1/1998 | Butler |
| 5,892,389 A | 4/1999 | Lai |
| 7,245,175 B2 | 7/2007 | Morita |
| 7,408,399 B2 | 8/2008 | Salato et al. |
| 7,557,637 B2 | 7/2009 | Sakamoto |
| 7,777,553 B2 | 8/2010 | Friedrichs |
| 8,228,113 B2 | 7/2012 | Domes |
| 8,487,667 B2 | 7/2013 | Iwamura |

(Continued)

FOREIGN PATENT DOCUMENTS

DE    102010027832 B3    7/2011

*Primary Examiner* — Lincoln Donovan
*Assistant Examiner* — Khareem E Almo
(74) *Attorney, Agent, or Firm* — Slater Matsil, LLP

(57) ABSTRACT

In accordance with an embodiment, a circuit includes a normally-off transistor, and a normally-on transistor comprising a second load path terminal coupled to a first load path terminal of the normally off transistor, and a control terminal coupled to a second load path terminal of the normally-off transistor. The circuit further includes a driver circuit having an output coupled to a control terminal of the normally off transistor, a first power supply terminal configured to be coupled to a first power supply terminal of a first power supply, and a second power supply terminal configured to be coupled to a second power supply terminal of a second power supply. The second load path terminal of the normally on transistor is further configured to be coupled to a second power supply terminal of the first power supply and to a first power supply terminal of the second power supply.

20 Claims, 6 Drawing Sheets

(56) References Cited

U.S. PATENT DOCUMENTS

| | | |
|---|---|---|
| 2009/0009232 A1 | 1/2009 | Helfrich et al. |
| 2009/0160496 A1 | 6/2009 | Takeuchi |
| 2009/0251217 A1 | 10/2009 | Keerti |
| 2010/0109781 A1 | 5/2010 | Deguchi et al. |
| 2011/0025422 A1 | 2/2011 | Marra et al. |
| 2012/0133397 A1 | 5/2012 | Draxelmayr et al. |
| 2012/0133420 A1 | 5/2012 | Draxelmayr et al. |
| 2013/0009674 A1* | 1/2013 | Reese ............... H03K 3/0315 327/109 |
| 2014/0049296 A1 | 2/2014 | Jeon et al. |
| 2014/0078781 A1 | 3/2014 | Imada |
| 2014/0146428 A1* | 5/2014 | Pansier ............ H03K 17/0822 361/86 |
| 2014/0218112 A1 | 8/2014 | Brantley et al. |
| 2015/0137619 A1* | 5/2015 | Seeman ............... H02H 3/00 307/116 |
| 2015/0318851 A1* | 11/2015 | Roberts ............... H01L 25/18 327/109 |

* cited by examiner

SYSTEM AND METHOD FOR A SWITCH HAVING A NORMALLY-ON TRANSISTOR AND A NORMALLY-OFF TRANSISTOR

CROSS-REFERENCE TO RELATED APPLICATIONS

This application relates to the following co-pending and commonly assigned patent application Ser. No. 14/473,207, filed Aug. 29, 2014, which application is incorporated herein by reference in its entirety.

TECHNICAL FIELD

The present disclosure relates generally to an electronic device, and more particularly to a system and method for a switch having a normally-on transistor and a normally-off transistor.

BACKGROUND

Power supply systems are pervasive in many electronic applications from computers to automobiles. Generally, voltages within a power supply system are generated by performing a DC-DC, DC-AC, and/or AC-DC conversion by operating a switch loaded with an inductor or transformer. One class of such systems includes switched mode power supplies (SMPS). An SMPS is usually more efficient than other types of power conversion systems because power conversion is performed by controlled charging and discharging of the inductor or transformer and reduces energy lost due to power dissipation caused by resistive voltage drops.

Specific topologies for SMPS comprise buck-boost converters and flyback converters, among others. A buck-boost converter typically makes use of an inductor whereas a flyback converter isolates a load and may multiply the voltage conversion ratio through the use of a transformer. In addition to the energy storage element (either inductor or transformer), the operation of the switch is of particular importance, especially in high voltage applications.

One issue that arises with respect to operating semiconductor switches in high voltage environments is avoiding device destruction due to high voltages being applied to the semiconductor switch. Some systems rely on using devices that are specifically designed to withstand high bus voltages encountered in high voltage power supplies. However, even when high voltage devices are used, some design challenges remain with respect to ensuring that devices in the power supply circuit are able to withstand high voltage transient conditions that may arise within the switched-mode power supply. For example, in some switched-mode power supplies, transient voltages within the power supply circuit may exceed the DC or quiescent bus voltages present within the power supply system.

SUMMARY OF THE INVENTION

In accordance with an embodiment, a circuit includes a normally-off transistor, and a normally-on transistor comprising a second load path terminal coupled to a first load path terminal of the normally off transistor, and a control terminal coupled to a second load path terminal of the normally-off transistor. The circuit further includes a driver circuit having an output coupled to a control terminal of the normally off transistor, a first power supply terminal configured to be coupled to a first power supply terminal of a first power supply, and a second power supply terminal configured to be coupled to a second power supply terminal of a second power supply. The second load path terminal of the normally on transistor is further configured to be coupled to a second power supply terminal of the first power supply and to a first power supply terminal of the second power supply.

BRIEF DESCRIPTION OF THE DRAWINGS

For a more complete understanding of the present invention, and the advantages thereof, reference is now made to the following descriptions taken in conjunction with the accompanying drawings, in which.

Figure 1A:
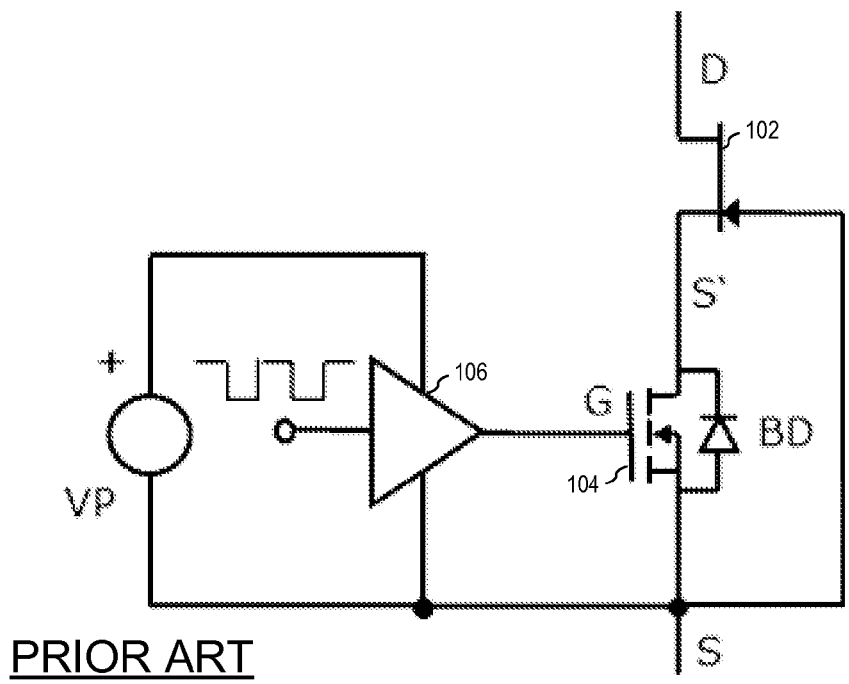
FIGS. 1a-1b illustrate conventional compound switching circuits.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a switch having a normally-on transistor coupled in series with a normally-off transistor. Embodiments of the present invention may also be applied to various systems that utilize such a circuit structure, for example, switched-mode power supplies.

In an embodiment of the present invention, a switch controller for driving a compound switch having a normally-on transistor in series with a normally-off transistor includes a driver circuit configured to drive the gate of a normally-off transistor, such as an enhancement mode MOSFET, while the gate of the normally-on transistor is coupled to the source of the normally-off transistor. By referencing the driver circuit to the drain of the normally-off transistor, large transients at this drain of the normally-off transistors may be attenuated and/or eliminated. Accordingly, voltage stress on the normally-off device is reduced, thereby allowing the normally off device to be sized and configured to reduce switching losses. Such embodiment switches may be used in various switching circuits, such as switched-mode power supplies, power factor controllers (PFC) and other power conversion circuits.

Certain types of power transistors, such as the junction field effect transistor (JFETs) and gallium nitride (GaN) high electron mobility transistor (HEMT) behave as "normally-on" devices in that they are in a conductive state when zero volts is applied between the gate and source of the transistor. In order to switch these transistors off, a sufficiently high negative gate voltage is applied between the gate and the source of the transistor. For example, in the case of a GaN HEMT, this reverse voltage may be between about −5 V and about −8 V; however, turn off voltages outside of this range may also occur in some devices. Accordingly, in some systems, such as those that utilize charge pumps to develop negative bias voltages, there is a risk that the normally-on device may cause a short circuit between the power supply rails of the device before the charge pump has sufficient time to produce a sufficiently high negative voltage to turn off the normally-on device. Moreover, there is also a risk of short circuits during various fault conditions.

One way in which this issue has been dealt with is by coupling the normally-on device in series with a normally-off device such as an enhancement mode MOSFET device in a cascode configuration, as illustrated in FIG. 1a. As shown, the source of the normally-on device 102 is coupled to the drain of the normally-off device 104 at node S', and the gate G of the normally-off device 104 is driven by driver circuit 106.

Here, the gate G of the normally-off device 104 acts as the control terminal that is driven by driver circuit 106, whereas the gate of normally-on device 102 is connected to the source S of normally-off device 104. During startup, the series combination of the normally-on device and the normally-off device is non-conductive. Once the requisite supply voltage becomes available, the normally-off device may be driven with an input signal, such that the normally-on device functions as a cascode device. If the current flow through the switch is forced in the reverse direction, the body diode BD of the normally-off device 104 becomes forward biased. Due to the circuit topology (i.e. connecting the source node S' of normally-on transistor 102 with the source node S of normally-off transistor 104), the normally-on device remains in its on-state, i.e. VGD>0.

There are, however, a number of issues with the composite device when operated as a cascode. First, switching losses may occur because the gate-source capacitance of normally-on device 102 is driven by the high power supply and not by the low gate driver supply voltage. Furthermore, additional switching losses may occur because of the drain capacitance of normally-off device 104, which may be a very large device in order to handle low currents and have a low impedance. As the parasitic drain capacitance of normally-off device 104 is being charged and discharged during operation, power is lost.

Another issue with the cascode configuration is that there is a potential for voltage stress on normally-off device 104. For example, during operation, the voltage at node S' may have large voltage transients due to capacitive coupling from the drain of normally-on device 102. In other words, the voltage at node S goes beyond the negative threshold of normally-on device 102, and may reach 20 V and above in some fast switching conditions.

Figure 1B:
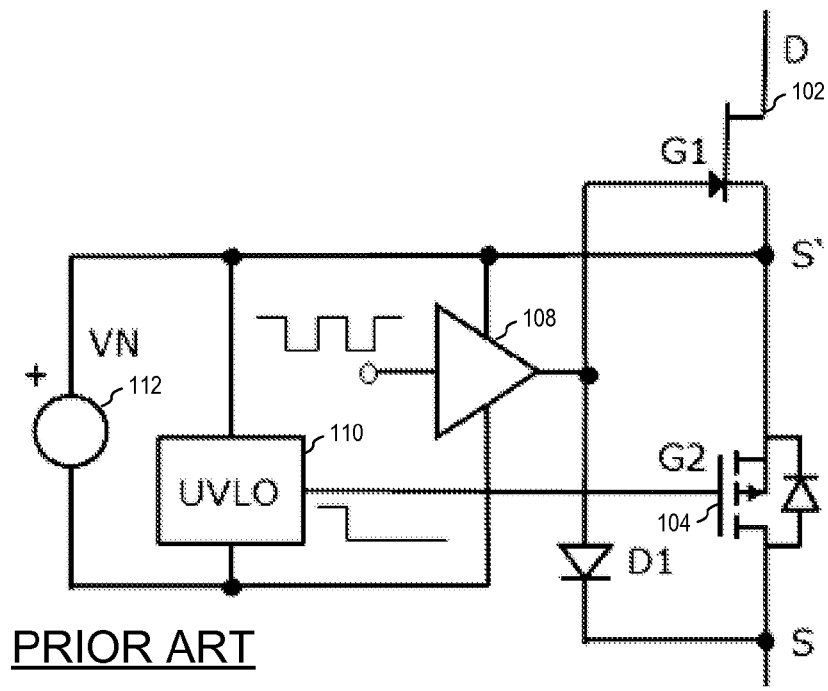

FIG. 1b illustrates another manner in which compound device including a normally-on transistor and a normally-off transistor may be operated. Here the gate G1 of normally-on device 102 is directly driven using driver 108 and gate G2 of normally-off device 104 is turned on according to the output of under voltage lockout block 110, which turns on normally-off device 104 after power supply 112 has reached a voltage sufficient to turn off normally-on device 102. During normal operation, normally-off device 104 remains in an on state. During startup and failure conditions, normally-off device 104 may be shut off, and diode D1 prevents the drain voltage of the normally-on device from reaching high voltages by clamping the gate G1 of normally-on device 102 to the source voltage of normally-off device 104. In such a directly driven configuration, however, the dedicated drivers may be needed to drive both gates G1 and G2 of normally-on device 102 and normally-off device 104. Another issue with the directly driven approach is that a high reverse current across the series connected devices results in a high voltage drop across normally-on device 102.

Figure 2:
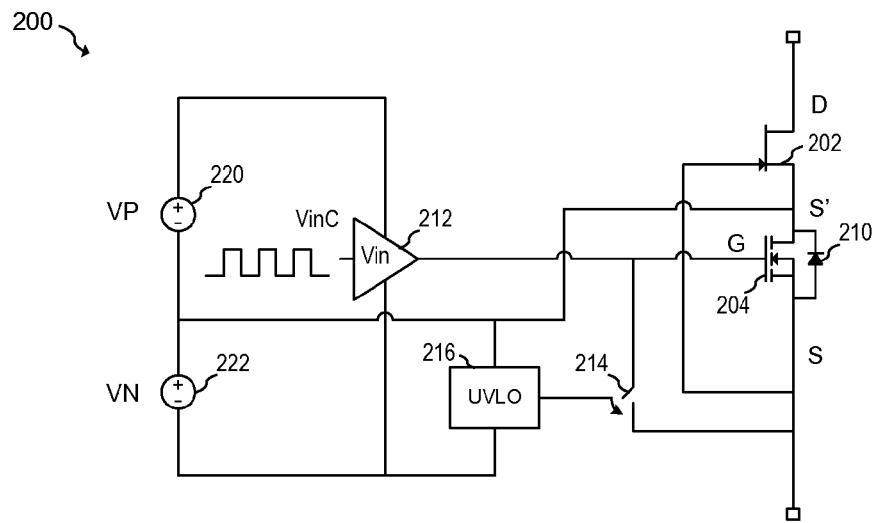
FIG. 2 illustrates a switching circuit according to an embodiment of the present invention.

FIG. 2 illustrates compound switch and driver 200 according to an embodiment of the present invention that includes normally-on device 202 coupled in series with normally-off device 204. As shown, normally-on device 202 and normally-off device 204 are driven in a cascode configuration. The body diode of normally-off device 204 is represented by diode 210. The gate of normally-on device 202 is coupled to source node S of normally-off device 204 and the gate of normally-off device 204 is driven by driver circuit 212 based on a switching input signal received at input pin VinC. Under voltage lockout circuit 216 keeps normally-off device 204 OFF until it senses that power supply 222 has developed a voltage that is sufficient to operate the system. In one embodiment, voltage lockout circuit 216 keeps normally-off device 204 OFF until it senses that the voltage of power supply 222 has exceeded a threshold. In some embodiments, this threshold may be between 5 V and about 12 V, preferably 10 V. However, voltages outside of these ranges may also be used depending on the particular embodiments and its specifications.

As shown, power supply 220 is configured to produce voltage VP and power supply 222 is configured to produce voltage VN. In some embodiments, power supply voltage VP is between about 5 V and about 12 V, and power supply voltage VN is between about 5 V and about 12 V. Alternatively, voltages outside of this range may be used depending on the particular embodiment and its specifications.

The source node S' of normally-on device 202 is coupled to the common node between power supply 220 and power supply 222. In an embodiment, driver circuit 212 is configured to provide a switching signal to the gate of normally-off device 204 that switches between a voltage of the positive terminal of power supply 220 and a voltage of the negative terminal of power supply 222. In an embodiment, normally-on device 202 is implemented using a GaN HEMT device and normally-off device 204 is implemented using an n-channel MOSFET device.

As shown, the switching voltages produced by driver circuit 212 are referenced to the drain of normally-off device 204. By referencing the switching voltages to the drain node S' of normally-off device 204, large transients at drain node S' of normally-off device 204 are attenuated and/or eliminated because of how power supply 220 and power supply 222 are referenced.

In an embodiment, the operation of compound switch and driver 200 proceeds as follows. Due to the connection of the gate of the normally-off device 202 to the MOSFET source of normally-off device 204, $$V_{GS,GaN} + V_{DG,MOS} + V_{GS,MOS} = V_{SS} + V_{S'G} + V_{GS} = 0, \qquad (1)$$

where $V_{GS,GaN}$ and $V_{SS'}$ represent the gate-source voltage of normally-on device 202, $V_{DG,MOS}$ and $V_{S,G}$ represent the drain-gate voltage of normally-off device 204, and $V_{GS,MOS}$ and $V_{GS}$ represent the gate-source voltage of normally-off device 204. Accordingly, it is possible to control this arrangement via a voltage $V_{GD,MOS}$ applied between the gate and drain of normally-off device 204.

In an embodiment, the ON state is defined by $V_{GD,MOS} = -V_{S'G} = VP$. From (1), the following relationship is derived: $V_{GS,GaN} + V_{DS,MOS} = VP$. Therefore, $$V_{GS,GaN} = -V_{DS,MOS} = -R_{on,MOS} * I, \quad (2)$$

where $R_{on,MOS}$ is the on resistance of normally-off device 204 and I is the current flowing though normally-on device 202 and normally-off device 204. Since the expression of equation (2) is negative, $V_{GS,MOS}$ is always larger than VP. Thus, the normally-off device 204 can simply be switched on by means of a positive voltage VP higher than its threshold, similar to the standard case. From equation (2), it is also apparent that normally-on device 202 is also on. Since the voltage drop across a MOS channel typically is very small, thus gate-to-source voltage of normally-on device 202 is slightly negative, but still sufficiently above its threshold.

In an embodiment, the ON-state is defined by $V_{GS,GaN} > V_{th,GaN}$ and $V_{GS,MOS} > V_{th,MOS}$, where $V_{th,GaN}$ is the threshold of normally-on device 202 and $V_{th,MOS}$ is the threshold of normally-off device 204. Accordingly, $$V_{GS,GaN} + V_{GS,MOS} = V_{GD,MOS} > V_{th,GaN} + V_{th,MOS} \quad (3)$$

is a necessary ON-condition. In the OFF state, driver circuit 212 forces $V_{GD,MOS}$ to be equal to VN. The overall structure is OFF if the necessary "on"—condition (3) is not fulfilled, such that $VN < V_{th,GaN} + V_{th,MOS}$. Accordingly, the circuit of FIG. 2 behaves like a classic cascode, although a negative voltage is used to switch the devices off. To guarantee that the circuit is in an OFF state if the requisite voltages are not available, for example, during start-up or during a failure, under voltage lockout circuit 216 senses the presence of a sufficiently large voltage VN produced by power supply 222. Closing switch 214 keeps the circuit in an OFF state even when voltage VN of power supply 222 has not been charged to a sufficient voltage to operate the system.

In an embodiment, the OFF state voltage across normally-off device 204 is limited. According to (1), the voltage between S' and S is given by $$V_{DS,MOS} = V_{S'S} = V_{S'G} + V_{GS} = VN + V_{th,MOS} \quad (4)$$

and is limited to this value. Since an increase in the voltage at S' tends to turn on normally-off device 204, a negative feedback loop via driver circuit 212 limits this voltage to the value given in (4). By limiting the voltage across normally-off device 204 in this manner, a trade-off between stress and efficiency is not necessary to be made in some embodiments. In other words, the normally-off device 204 may be sized small in order to minimize switching losses without the penalty of dealing with large voltage transients between nodes S and S'.

In embodiments of the present invention, compound switch and driver 200 may be used to implement switches in a wide variety of electronic circuits. For example, compound switch and driver 200 may be used to implement switches in switched-mode power supplies, power factor converters, and H-bridge circuits such as those described in co-pending application Ser. No. 14/473,207 filed on Aug. 29, 2014.

Figure 3A:
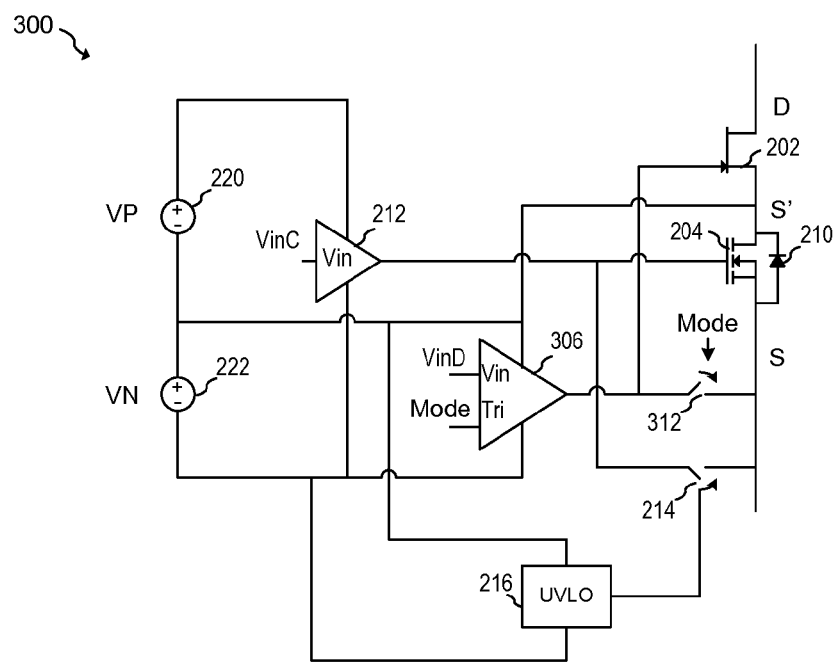
FIGS. 3a-3b illustrates a compound switching circuits according to further embodiments.

FIG. 3a illustrates an embodiment compound switch and driver 300 that is configurable to operate in a cascode mode and in a direct drive mode. Compound switch and driver 300 is similar to the compound switch and driver 200 illustrated in FIG. 2 with the addition of tri-state driver circuit 306 having an output coupled to the gate of normally-on transistor 202, and switch 312 that is controlled by a Mode signal. During cascode mode operation, switch 312 is closed, thereby coupling the gate of normally-on transistor 202 to the source of normally-off device 204, and the output of tri-state driver circuit 306 is placed in a high impedance state. A switching signal is introduced at input VinC of driver circuit 212. Consequently, compound switch and driver 300 operates in the same matter as compound switch and driver 200 described above in FIG. 2. In other words, normally-on transistor 202 functions as a cascode device and normally-off device 204 provides the switching signal.

During direct drive operation, switch 312 is opened, and a high level logic signal is applied to input VinC of driver circuit 212, thereby turning-on normally-off device 204. A switching signal is applied to input VinD of driver circuit 306, which, in turn, applies the switching signal to the gate of normally-on transistor 202, thereby turning on and off normally-on transistor 202 according to the switching signal. In one embodiment, driver circuit 306 toggles the gate of normally-on transistor 202 is between the potential of source node S' of normally-on transistor 202 and the potential at the negative terminal of power supply 222. Accordingly, normally-on transistor 202 is turned on by applying zero volts between its source and drain terminal, and is turned off by applying a negative voltage of about VN between its source and drain terminals.

Figure 3B:
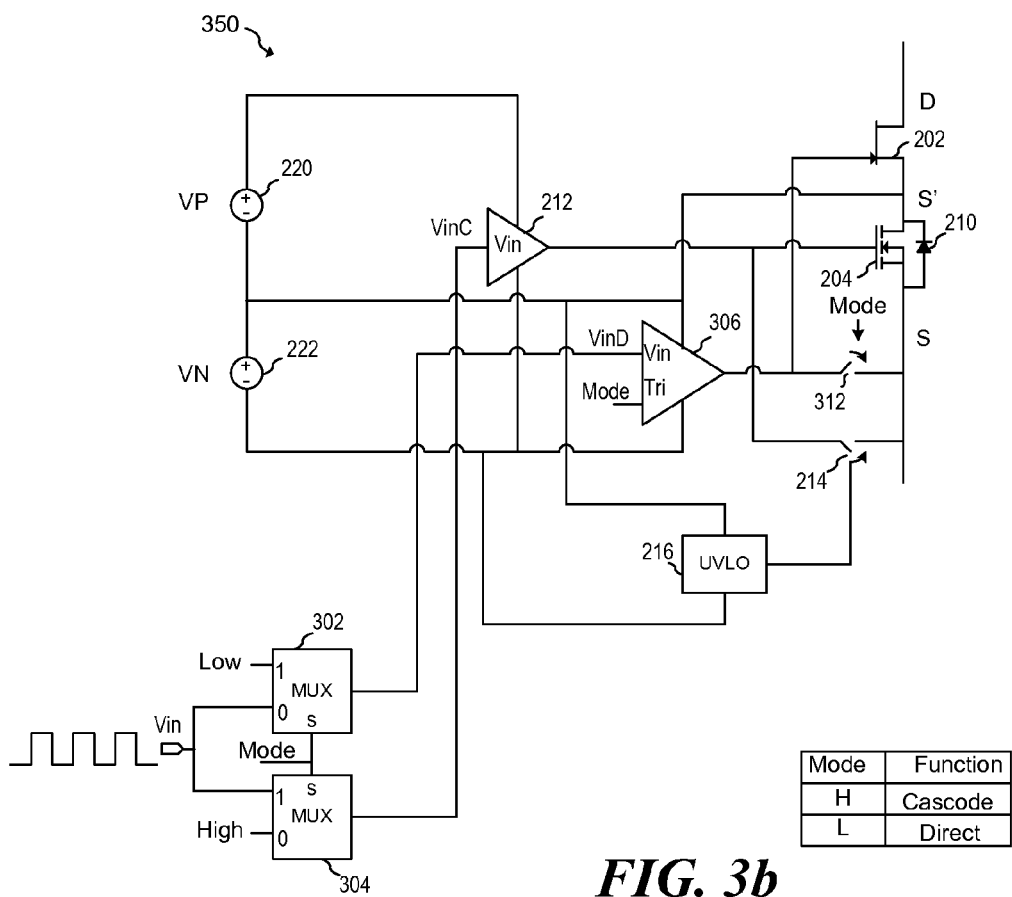

FIG. 3b illustrates embodiment compound switch and driver system 350 according to a further embodiment that includes additional mode control circuitry. As shown, input signal Mode controls the mode of compound switch and driver system 350 such that when a logic HIGH is applied to the Mode input, the system operates in a cascode mode and when a logic LOW is applied to the Mode input, the system operates in a directly driven mode. As illustrated, the Mode input signal is applied to switch 312, to tri-state input pin Tri of driver circuit 306, and to multiplexers 302 and 304. Thus, when a logic HIGH is applied to the Mode input signal, switch 312 is closed and the output of tri-state driver circuit 212 is set to a high impedance, thereby coupling source node S of normally-off device 204 to the gate of normally-on device 202. The mode input signal also routes input switching signal Vin to input VinC of driver circuit 212 via multiplexer 304 and a logic LOW signal to input VinD of tri-state driver circuit 306 via multiplexer 302, thereby routing the input switching signal to driver circuit 212. In some embodiments, a logic HIGH signal may be provided to input VinD of tri-state driver circuit 306, since tri-state driver circuit 3-6 operates in a high impedance output mode.

On the other hand, when a logic LOW is applied to the Mode input signal, switch 312 is opened and tri-state driver circuit 306 is configured to drive the gate of normally-on device 202, thereby driving normally-on device 202 directly. The Mode input signal also routes input switching signal Vin to input VinD of tri-state driver circuit 306 via multiplexer 302 and a logic HIGH signal to input VinC of driver circuit 212 via multiplexer 304, thereby routing the input switching signal to driver circuit 306 and turning on normally-off device 204.

It should be appreciated that the compound switch and driver system 350 shown in FIG. 3b is just one specific embodiment example of a compound switch and driver system. In alternative embodiments, other functionally similar circuits and topologies may be used. For example, in some embodiments, the polarity of the Mode input signal may be inverted such that a HIGH Mode input signal selects the directly driven mode and a LOW Mode input signal selects the cascode mode. In some embodiments, multi-bit selection logic may be used.

Figure 4:
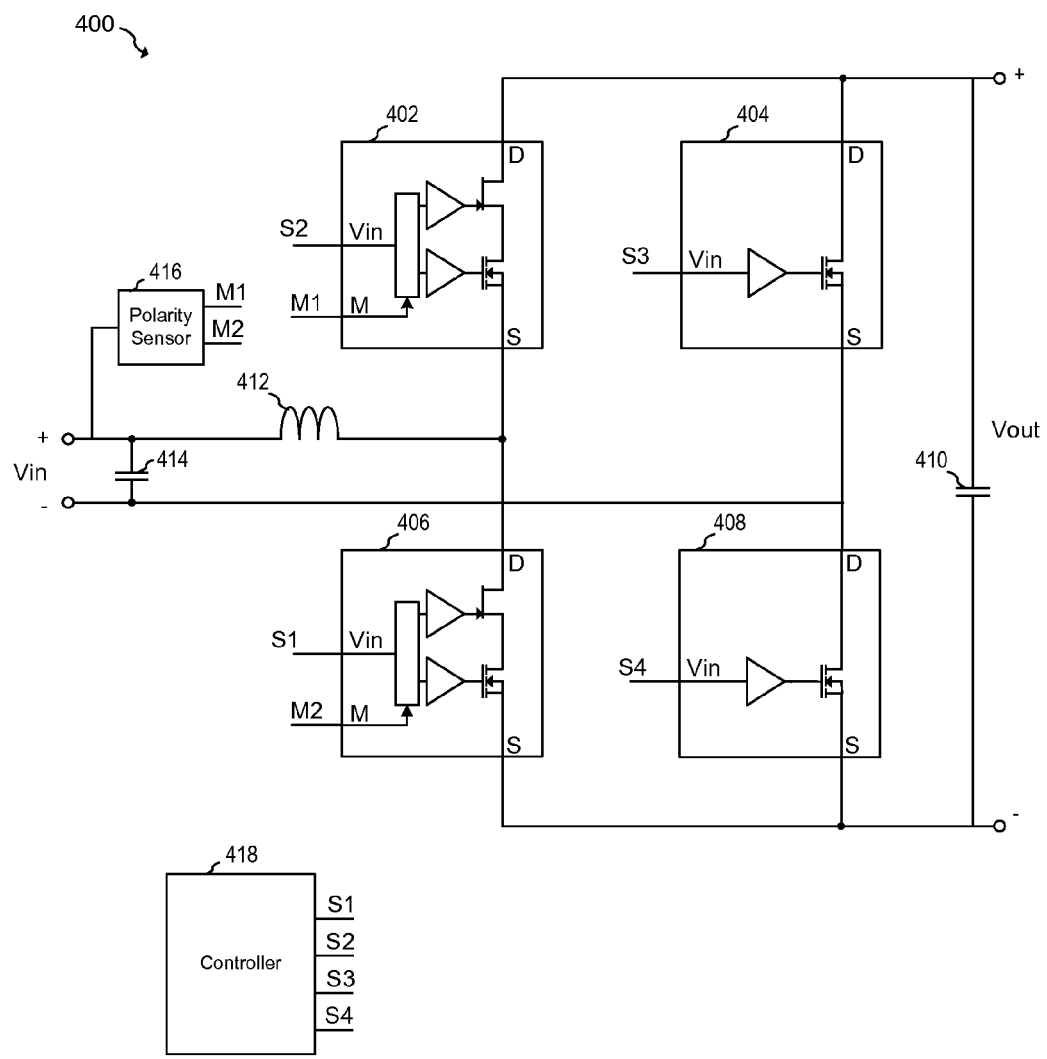
FIG. 4 illustrates an embodiment switched-mode power supply circuit that utilizes embodiment switching circuits.

FIG. 4 illustrates switched-mode power converter 400 according to an embodiment of the present invention that is configured to convert an AC input signal, such as a 50 Hz to 60 Hz line voltage at input port Vin to a DC output voltage at output port Vout. For example, in one embodiment, switched-mode power converter 400 is configured to convert a 120 VAC or 240 VAC input 50 Hz to 60 Hz power line input voltage to a DC output voltage of about 400 V. Alternatively, other input and voltages operated at the same or different frequency ranges may be used.

Switched-mode power converter 400 includes an H-bridge implemented using embodiment compound switch and drivers 402 and 406 according to embodiments described herein. This H-bridge is coupled to input port Vin via inductor 412. During operation of switched-mode power converter 400, compound switch and drivers 402 and 406 magnetize and demagnetize inductor 412 such that power is transferred from input port Vin to output port Vout. Capacitor 414 represents the input capacitance of switched-mode power converter 400 and capacitor 410 represents the load capacitance of switched-mode power converter 400. Each embodiment compound switch and driver 402 and 406 includes a normally-on device coupled in series with a normally-off device and is configured to receive a switching signal at input pin Vin and a mode select signal at input pin M. In an embodiment, controller 418 provides switching signals to embodiment compound switch and drivers 402 and 406 and to switch and drivers 404 and 408, the timing of which are configured to convert an AC input signal at input port Vin to a DC output signal at port Vout. Controller 418 may be implemented using an H-bridge-based switched mode power controller known in the art. In some embodiments controller 418 may utilize current and/or voltage feedback from various nodes and current branches of switched-mode power converter 400 in order to provide feedback control of the output voltage, output current, and/or input currents. For example, the switching of signals S1, S2 coupled to compound switch and drivers 406 and 402, and switching signals S3 and S4 coupled to switch and drivers 404 and 408 may be configured to provide a controlled output voltage and a controlled input current such that power factor correction is achieved. In an embodiment, drivers 404 and 408 provide a return current path and may be implemented using synchronous rectifiers being driven with switching signals S3 and S4 as shown. In such embodiments, compound switch and drivers 404 and 408 may be configured as cascode devices. In alternative embodiments, a simple diode or other switching structures may be used in place of compound switch and drivers 404 and 408.

In an embodiment, each of embodiment compound switch and drivers 402 and 406 are configured to operate in a cascode mode when a logic HIGH is asserted at input pin M and operates in a directly driven mode when a logic LOW is asserted at input pin M. In alternative embodiments, the polarity of the mode select signal may be reversed. Polarity sensor 416 is configured to sense the polarity of input line voltage Vin and produce mode signals M1 and M2 according to the sensed line voltage.

In an embodiment, the operating modes for embodiment compound switch and drivers 402 and 406 are selected such that switching losses are reduced and high voltage reverse bias conditions across the normally-on devices are avoided. For example, when the voltage at input port Vin has a positive polarity, compound switch and driver 406 coupled to control signals S1 essentially functions as a switch and compound switch and driver 402 coupled to control signals S2 essentially functions as a diode. Accordingly, when the voltage at input port Vin has a positive polarity, compound switch and driver 402 can be configured as cascode device and compound switch and driver 406 can be configured as directly driven device. By operating compound switch and driver 402 as cascode device when they function as diode, a large reverse voltage across the normally-on device can be avoided. Although switching losses are slightly higher, the total losses can be reduced in certain applications (particularly at high switching frequency at medium voltage). In other applications and under different conditions, any of the other possible combinations (switch operated in cascode mode, diode directly driven or both in cascode mode or both directly driven) may be used depending on the particular system and its specifications.

When Vin changes polarity, devices 402 and 406 change their function. Now 402 acts as a switch, whereas 406 acts as a diode. The assigned modes to embodiment compound switch and drivers 402, 406 and are reversed. For example, compound switch and drivers 406 and are operated as directly driven devices and compound switch and drivers 402 and are operated as cascode devices. By dynamically changing the operating modes of embodiment compound switch and drivers 402 and 406 and during the various operational phases of switched-mode power converter 400, increased efficiency may be achieved due to reduced switching losses caused by the parasitic capacitances of the normally-off devices.

Figure 5:
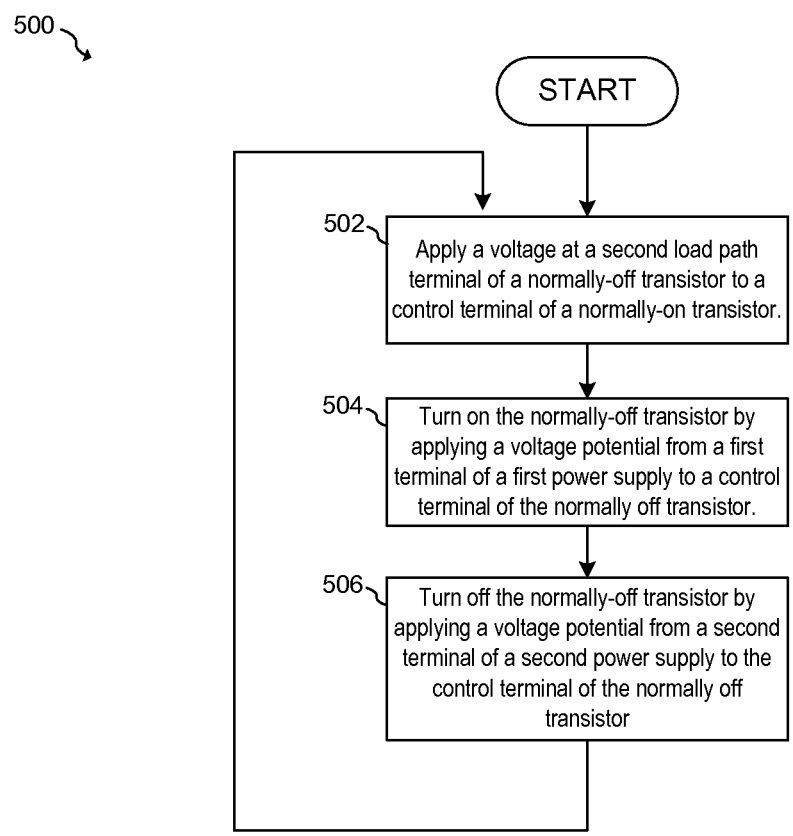
FIG. 5 illustrates a flowchart of an embodiment method.

FIG. 5 illustrates a flowchart of an embodiment method 500 of driving a compound switch that includes a normally-off transistor having a first load path terminal coupled to a second load path terminal of a normally-on transistor. In step 502, voltage at a second load path terminal of the normally-off transistor is applied to a control terminal of the normally-on transistor. In steps 504 and 506, the normally off transistor is turned on and off according to a switching signal applied between its gate and the first load path terminal. More specifically, in step 504, the normally-off transistor is turned-on by applying a voltage potential from a first terminal of a first power supply to a control terminal of the normally-off transistor. In step 506, the normally-off transistor is turned-off by applying a voltage potential from a second terminal of a second power supply to the control terminal of the normally-off transistor.

Figure 6:
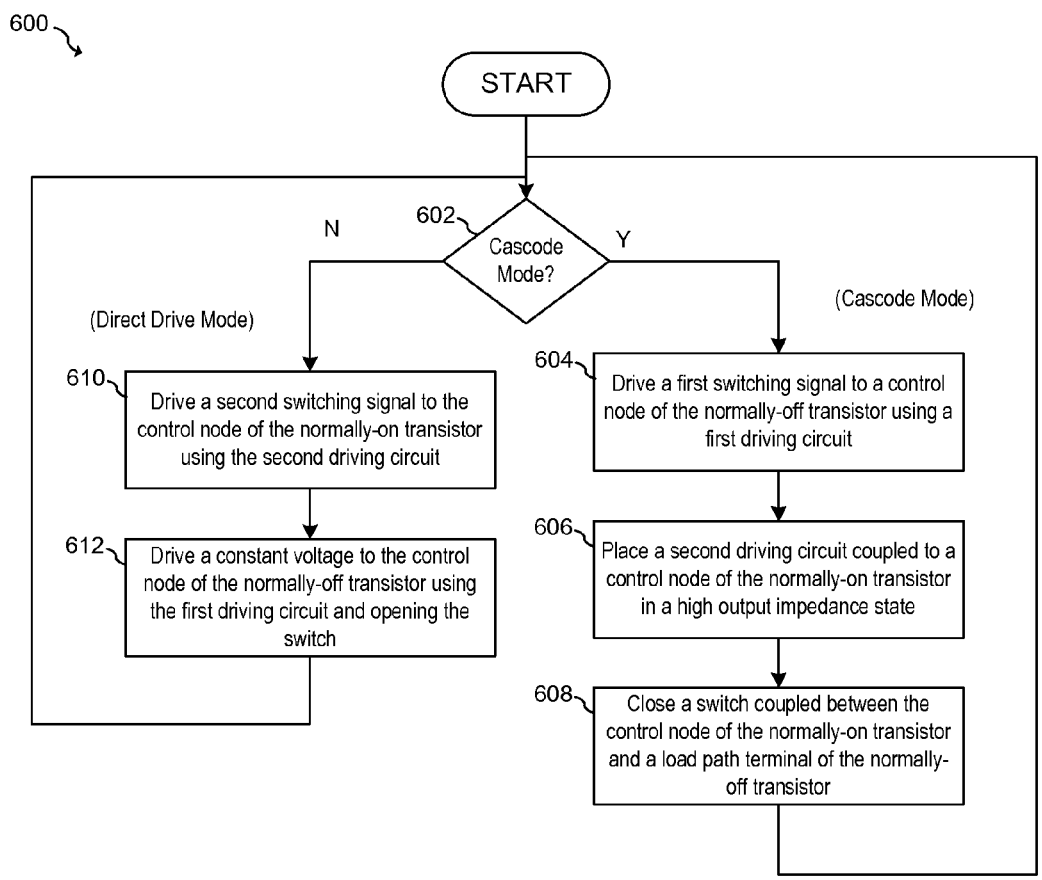
FIG. 6 illustrates a flow chart of a further embodiment method.

FIG. 6 illustrates a flowchart of an embodiment method 600 of driving a compound switch that includes a normally-on transistor coupled in series with a normally-off transistor. In an embodiment, a determination is made as to whether the compound switch is to operate in a cascode mode or a direct drive mode in step 602. This determination may be made, for example, based on a polarity of an input AC signal, as described in the embodiment of FIG. 4. If the cascode mode is selected, a first switching signal is coupled to a control node of a normally-off transistor using a first driving circuit in step 604. Concurrently in step 606, a second driving circuit is coupled to a control node of a normally-on transistor while its output is in a high-impedance state. A switch coupled between the control node of the normally-on transistor and a load path terminal of the normally-off transistor is closed in step 608.

If the direct drive mode is selected in step 602, a second switching signal is coupled to the control node of the normally-on transistor using the second driving circuit in step 610. In step 612, a constant voltage is coupled to the control node of the normally-off transistor using the first driving circuit. The switch coupled between the control node of the normally-on transistor and the load path terminal of the normally-off transistor is opened.

In accordance with an embodiment, a circuit includes a normally-off transistor, and a normally-on transistor comprising a second load path terminal coupled to a first load path terminal of the normally off transistor, and a control terminal coupled to a second load path terminal of the normally-off transistor. The circuit further includes a driver circuit having an output coupled to a control terminal of the normally off transistor, a first power supply terminal configured to be coupled to a first power supply terminal of a first power supply, and a second power supply terminal configured to be coupled to a second power supply terminal of a second power supply. The second load path terminal of the normally on transistor is further configured to be coupled to a second power supply terminal of the first power supply and to a first power supply terminal of the second power supply.

In an embodiment, the normally-on transistor includes a GaN HEMT device, the first load path terminal of the normally-on transistor comprises a drain of the GaN HEMT device, the second load path terminal of the normally-on transistor includes a source of the GaN HEMT, and the control terminal of the normally-on transistor includes a gate of the GaN HEMT device. In some embodiments, the normally-off transistor is implemented using an enhancement mode MOSFET transistor, the first load path terminal of the normally-off transistor includes a drain of the enhancement mode MOSFET transistor, the second load path terminal of the normally-off transistor includes a source of the enhancement mode MOSFET transistor, and the control terminal of the normally-off transistor includes a gate of the enhancement mode MOSFET transistor.

In some embodiments, the first power supply terminal of the first power supply is configured to have a higher voltage than the second power supply terminal of the first power supply, and the first power supply terminal of the second power supply is configured to have a higher voltage than the second power supply terminal of the second power supply. In some implementations, the circuit further includes the first power supply and the second power supply.

The circuit may further include an undervoltage lockout protection circuit configured to turn off the normally-off transistor when a voltage of the second power supply is below a threshold. In an embodiment, the circuit also includes a switch coupled between the control terminal of the normally-off transistor and the second load path terminal of the normally-off transistor. The undervoltage lockout protection circuit is configured to close the switch when the voltage of the second power supply is below the threshold, and to open the switch when the voltage of the second power supply is above the threshold.

In accordance with a further embodiment, method directed toward a switch comprising a normally-off transistor having a first load path terminal coupled to a second load path terminal of a normally-on transistor includes: applying a voltage at a second load path terminal of the normally-off transistor to a control terminal of the normally-on transistor, turning on the normally-off transistor by applying a voltage potential from a first terminal of a first power supply to a control terminal of the normally off transistor, and turning off the normally-off transistor by applying a voltage potential from a second terminal of a second power supply to the control terminal of the normally off transistor. The first load path terminal of the normally-off transistor and the second load path terminal of the normally on transistor are coupled to a second terminal of the first power supply and to a first terminal of the second power supply.

In an embodiment, the method further includes measuring a first voltage between the first terminal of the second power supply and the second terminal of the second power supply, and turning off the normally-off transistor when the first voltage is less than a threshold.

In an embodiment, the normally-on transistor and the normally-off transistor are each implemented using FET transistors, the second load path terminal of the normally-on transistor includes a source of the normally on transistor, and the control terminal of the normally-on transistor includes a gate of the normally-on transistor, the first load path terminal of the normally-off transistor includes a drain of the normally-off transistor, and the load path terminal of the normally-off transistor includes a source of the normally-off transistor. In one example, the normally-off transistor may be implemented using an enhancement mode MOSFET and the normally-on transistor may be implemented using a GaN HEMT.

In an embodiment, turning on the normally-off transistor and turning off the normally off transistor includes applying a switching signal to an input of a driver circuit and driving the control terminal of the normally-off transistor with an output of the driver circuit. The method may further include magnetizing and demagnetizing an inductor in a switched-mode power supply using the switch.

In an embodiment, a switch includes an enhancement mode MOSFET transistor, a GaN HEMT transistor comprising a source coupled to a drain of the enhancement mode MOSFET transistor, and a gate coupled to a source of the enhancement mode MOSFET transistor. The switch further includes a driver circuit having an output coupled to a gate of enhancement mode MOSFET transistor, a first power supply terminal configured to be coupled to a positive terminal of a first power supply, and a second power supply terminal configured to be coupled to a negative terminal of a second power supply. The negative terminal of the first power supply, the positive terminal of the second power supply, the source of the GaN HEMT and the drain of the enhancement mode MOSFET are configured to be coupled together. In an embodiment, the switch further includes the first power supply and the second power supply.

The switch may further include a power supply sensing circuit coupled to the second power supply, and a first switch coupled to the gate of the enhancement mode MOSFET. In some embodiments, the power supply sensing circuit is configured to turn-off the enhancement mode MOSFET via the first switch when the power supply sensing circuit detects that a voltage of the second power supply is below a threshold.

In an embodiment, the switch is coupled between the gate of the enhancement mode MOSFET and a source of the enhancement mode MOSFET, which may be implemented, for example, using an n-channel device. In some embodiments, a switched mode power supply is coupled to the switch.

Advantages of embodiments include the reduction of switching losses and losses due to the voltage drop of reversed-biased normally-on transistors. A further advantage of embodiments includes the ability to operate a normally-on device coupled in series with a normally-off device without overstressing the normally-off device. Accordingly, the normally-off device may be sized and configured in a manner to reduce switching losses.

Further advantages of embodiments include optimization possibilities for different applications by choosing the best suited combination of operating modes.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A circuit comprising:
   a normally-off transistor;
   a normally-on transistor comprising a second load path terminal coupled to a first load path terminal of the normally-off transistor, and a control terminal coupled to a second load path terminal of the normally-off transistor; and
   a driver circuit comprising an output coupled to a control terminal of the normally-off transistor, a first power supply terminal configured to be coupled to a first power supply terminal of a first power supply, and a second power supply terminal configured to be coupled to a second power supply terminal of a second power supply, wherein the second load path terminal of the normally-on transistor is further configured to be coupled to a second power supply terminal of the first power supply and to a first power supply terminal of the second power supply via a circuit path separate from a load path of the normally-off transistor.

2. The circuit of claim 1, wherein the normally-on transistor comprises a GaN HEMT device, the first load path terminal of the normally-on transistor comprises a drain of the GaN HEMT device, the second load path terminal of the normally-on transistor comprises a source of the GaN HEMT device, and the control terminal of the normally-on transistor comprises a gate of the GaN HEMT device.

3. The circuit of claim 2, wherein the normally-off transistor comprises an enhancement mode MOSFET transistor, the first load path terminal of the normally-off transistor comprises a drain of the enhancement mode MOSFET transistor, the second load path terminal of the normally-off transistor comprises a source of the enhancement mode MOSFET transistor, and the control terminal of the normally-off transistor comprises a gate of the enhancement mode MOSFET transistor.

4. The circuit of claim 1, wherein:
   the first power supply terminal of the first power supply is configured to have a higher voltage than the second power supply terminal of the first power supply; and
   the first power supply terminal of the second power supply is configured to have a higher voltage than the second power supply terminal of the second power supply.

5. The circuit of claim 4, further comprising the first power supply and the second power supply.

6. The circuit of claim 1, further comprising an undervoltage lockout protection circuit configured to turn off the normally-off transistor when a voltage of the second power supply is below a threshold.

7. The circuit of claim 6, further comprising a switch coupled between the control terminal of the normally-off transistor and the second load path terminal of the normally-off transistor, wherein the undervoltage lockout protection circuit is configured to close the switch when the voltage of the second power supply is below the threshold, and to open the switch when the voltage of the second power supply is above the threshold.

8. A method of operating a switch comprising a normally-off transistor having a first load path terminal coupled to a second load path terminal of a normally-on transistor, the method comprising:
   applying a voltage at a second load path terminal of the normally-off transistor to a control terminal of the normally-on transistor;
   turning on the normally-off transistor comprising applying a voltage potential from a first terminal of a first power supply to a control terminal of the normally-off transistor; and
   turning off the normally-off transistor comprising applying a voltage potential from a second terminal of a second power supply to the control terminal of the normally-off transistor, wherein the first load path terminal of the normally-off transistor and the second load path terminal of the normally-on transistor are coupled to a second terminal of the first power supply and to a first terminal of the second power supply.

9. The method of claim 8, further comprising:
   measuring a first voltage between the first terminal of the second power supply and the second terminal of the second power supply; and
   turning off the normally-off transistor when the first voltage is less than a threshold.

10. The method of claim 8, wherein:
    the normally-on transistor and the normally-off transistor each comprise FET transistors;
    the second load path terminal of the normally-on transistor comprises a source of the normally-on transistor, and the control terminal of the normally-on transistor comprises a gate of the normally-on transistor;
    the first load path terminal of the normally-off transistor comprises a drain of the normally-off transistor; and
    the second load path terminal of the normally-off transistor comprises a source of the normally-off transistor.

11. The method of claim 10, wherein the normally-off transistor comprises an enhancement mode MOSFET and the normally-on transistor comprises a GaN HEMT.

12. The method of claim 8, wherein turning on the normally-off transistor and turning off the normally-off transistor comprises applying a switching signal to an input of a driver circuit and driving the control terminal of the normally-off transistor with an output of the driver circuit.

13. The method of claim 8, further comprising magnetizing and demagnetizing an inductor in a switched-mode power supply using the switch.

14. A switch comprising:
    an enhancement mode MOSFET transistor;
    a GaN HEMT transistor comprising a source coupled to a drain of the enhancement mode MOSFET transistor, and a gate coupled to a source of the enhancement mode MOSFET transistor; and
    a driver circuit comprising an output coupled to a gate of enhancement mode MOSFET transistor, a first power supply terminal configured to be coupled to a positive terminal of a first power supply, and a second power supply terminal configured to be coupled to a negative terminal of a second power supply, wherein the negative terminal of the first power supply, the positive terminal of the second power supply, the source of the GaN HEMT transistor and the drain of the enhancement mode MOSFET transistor are configured to be coupled together via a circuit path separate from a load path of the enhancement mode MOSFET transistor.

15. The switch of claim 14, further comprising the first power supply and the second power supply.

16. The switch of claim 14, further comprising:
a power supply sensing circuit coupled to the second power supply; and
a first switch coupled to the gate of the enhancement mode MOSFET transistor.

17. The switch of claim 16, wherein the power supply sensing circuit is configured to turn-off the enhancement mode MOSFET transistor via the first switch when the power supply sensing circuit detects that a voltage of the second power supply is below a threshold.

18. The switch of claim 16, wherein the switch is coupled between the gate of the enhancement mode MOSFET transistor and a source of the enhancement mode MOSFET transistor.

19. The switch of claim 14, wherein the enhancement mode MOSFET transistor is an n-channel device.

20. The switch of claim 14, further comprising a switched mode power supply coupled to the switch.

\* \* \* \* \*